US012615994B2

(12) United States Patent
Xu et al.

(10) Patent No.: US 12,615,994 B2

(45) Date of Patent: Apr. 28, 2026

---

(54) WET-PROCESSING DARK LABORATORY FOR SCIENTIFIC RESEARCH

(71) Applicant: THE HONG KONG UNIVERSITY OF SCIENCE AND TECHNOLOGY (GUANGZHOU), Guangzhou (CN)

(72) Inventors: Wei Xu, Guangzhou (CN); Xiangjun Zeng, Guangzhou (CN); Yijie Li, Guangzhou (CN); Ji Li, Guangzhou (CN); Zhaoyang Wu, Guangzhou (CN)

(73) Assignee: THE HONG KONG UNIVERSITY OF SCIENCE AND TECHNOLOGY (GUANGZHOU), Guangzhou (CN)

( * ) Notice: Subject to any disclaimer, the term of this patent is extended or adjusted under 35 U.S.C. 154(b) by 0 days.

(21) Appl. No.: 19/082,592

(22) Filed: Mar. 18, 2025

(65) Prior Publication Data

US 2026/0082857 A1 Mar. 19, 2026

(30) Foreign Application Priority Data

Sep. 19, 2024 (CN) .......................... 202411304590.7

(51) Int. Cl.
*H10P 72/30* (2026.01)
*H10P 72/00* (2026.01)

(52) U.S. Cl.
CPC ...... *H10P 72/3402* (2026.01); *H10P 72/0411* (2026.01); *H10P 72/0422* (2026.01); *H10P 72/0451* (2026.01); *H10P 72/3202* (2026.01); *H10P 72/3214* (2026.01)

(58) Field of Classification Search
None
See application file for complete search history.

(56) References Cited

FOREIGN PATENT DOCUMENTS

| CN | 109427611 A | 3/2019 |
| CN | 113555304 A | 10/2021 |
| CN | 214624997 U | 11/2021 |
| CN | 114068365 A | 2/2022 |
| CN | 117140469 A | 12/2023 |
| CN | 117672936 A | 3/2024 |

(Continued)

OTHER PUBLICATIONS

CN 113555304 A, Wafer Box Conveying Device, Device, System And Conveying Method Thereof, Pan (Year: 2021).*

(Continued)

*Primary Examiner* — Cristi J Tate-Sims

(74) *Attorney, Agent, or Firm* — Quarles & Brady LLP

(57) ABSTRACT

A wet-processing dark laboratory for scientific research includes a laboratory body, a wet-processing equipment, a transfer robot, a sample supplying and storing apparatus, a chemical supplying and storing apparatus, and a control apparatus. The laboratory body is configured to provide a clean space. The transfer robot includes a moving device, a mechanical arm device, at least one end effector, and an accompanying device. The accompanying device can move with the moving device and provide a temporary storage space. The mechanical arm device is mounted on the moving device. The at least one end effector is mounted on the mechanical arm device for grasping a semiconductor sample and/or a chemical tank. The above design enables 24/7 experiments conduction without the need for human presence, which forms a dark laboratory.

14 Claims, 10 Drawing Sheets

(56)          References Cited

FOREIGN PATENT DOCUMENTS

| | | | | |
|---|---|---|---|---|
| CN | 117902214 A | 4/2024 | | |
| CN | 118053795 A | 5/2024 | | |
| EP | 4333037 A1 * | 3/2024 | ....... | H01L 21/67034 |
| JP | 2002353290 A | 12/2002 | | |
| KR | 20230130495 A | 9/2023 | | |
| KR | 20240088427 A | 6/2024 | | |

OTHER PUBLICATIONS

The State Intellectual Property Office of People's Republic of China, First Office Action and Search Report, Application No. 202411304590.7, Nov. 7, 2024, 16 pages.
The State Intellectual Property Office of People's Republic of China, Supplementary Search for CN Application No. 202411304590.7 and English translation, mailed Dec. 3, 2024, pp. 1-5.
Hua Qi, Ye Wangwei, Gong Sijia. Research on Unmanned Intelligent Mobile Robot [J]. Industrial Control Computer, 2020, 33(04): 26-27, 30.
European Patent Office. European search report for EP Application No. 25155749.2, mailed Nov. 4, 2025, 1 pp. 1-5.

* cited by examiner

WET-PROCESSING DARK LABORATORY FOR SCIENTIFIC RESEARCH

CROSS-REFERENCE TO RELATED APPLICATION

This application is based on and claims the benefit of priority from Chinese Patent Application No. 202411304590.7, filed on Sep. 19, 2024, the entirety of which is incorporated by reference herein.

TECHNICAL FIELD

The present disclosure relates to the technical field of semiconductor cleaning and etching, and in particular to a wet-processing dark laboratory for scientific research.

BACKGROUND

In the manufacturing process of semiconductor micro-nano devices, a wet-processing equipment is required for cleaning and acid-base etching of wafer surfaces. Although traditional enterprise-level wet-processing equipment is highly automated, it is only suitable for mass production and cannot meet flexible scenarios in scientific research. To address the above problems, a research-oriented fully automated wet etching system and equipment is disclosed in Chinese patent No. CN118053795B, so as to meet needs of scientific research in universities and improve efficiency of scientific research and process stability. However, such design can only realize automation of a single equipment, and a wet laboratory built by this design still needs manual operations and has following shortcomings.

1. It is difficult to further improve the efficiency of scientific research.
2. It is difficult to make full use of a wet-processing equipment for scientific research.
3. Experimental results are unstable and lack reliability.
4. Laboratory management is difficult, and experimental costs are high.
5. There are safety hazards for personnel.
6. Data collection and analysis efficiency is low.

To this end, there is an urgent need to provide a new design scheme to address the above shortcomings.

SUMMARY

In view of the above, an objective of the present disclosure is to provide a wet-processing dark laboratory for scientific research, so as to address the technical problems caused by existing wet laboratories for scientific research which still depends on manual operations.

To achieve the above technical objective, a wet-processing dark laboratory for scientific research is provided in the present disclosure, which includes a laboratory body, a wet-processing equipment, a transfer robot, a sample supplying and storing apparatus, a chemical supplying and storing apparatus, and a control apparatus.

The laboratory body is configured to provide a clean space.

The wet-processing equipment is arranged in the clean space for processing a semiconductor sample.

The sample supplying and storing apparatus is arranged in the clean space for providing a semiconductor sample to be processed and storing a processed semiconductor sample.

The chemical supplying and storing apparatus is arranged in the clean space for providing a chemical tank to be replaced and storing a replaced chemical tank.

The transfer robot is installed in the clean space for transferring the semiconductor sample and/or the chemical tank between the wet-processing equipment, the transfer robot, the sample supplying and storing apparatus and the chemical supplying and storing apparatus.

The transfer robot includes a moving device, a mechanical arm device, at least one end effector, and an accompanying device.

The accompanying device can move with the moving device and provide a temporary storage space.

The mechanical arm device is mounted on the moving device.

The at least one end effector is mounted on the mechanical arm device for grasping the semiconductor sample and/or the chemical tank.

The control apparatus is communicatively connected with the wet-processing equipment, the transfer robot, the sample supplying and storing apparatus, and the chemical supplying and storing apparatus.

Further, the accompanying device is detachably connected with the moving device.

The wet-processing dark laboratory for scientific research further includes an accompanying fixing frame.

The accompanying fixing frame is installed in the clean space for fixing the accompanying device.

The transfer robot further includes a forking device.

The forking device is mounted on the moving device for forking the accompanying device positioned on the accompanying fixing frame.

Further, the forking device includes a forking lifting device and a forking plate.

The accompanying fixing frame is provided with an avoidance cavity below the accompanying device for the forking plate to extend into.

The forking lifting device is mounted at a top of the moving device, with a driving end being connected with the forking plate for driving the forking plate to move up and down, so as to fork the accompanying device off from the accompanying fixing frame or fork the accompanying device back to the accompanying fixing frame.

Further, a plurality of first forking positioning structures are provided at a top of the forking plate.

A plurality of second forking positioning structures which are matched with the respective first forking positioning structures for positioning are provided at a bottom of the accompanying device.

Further, the accompanying device is internally provided with an accommodating cavity for forming the temporary storage space.

The accompanying device is provided with an accompanying door opening and closing mechanism for controlling opening and closing of the accommodating cavity.

Further, a first interfacing structure is provided at the bottom of the accompanying device.

The first interfacing structure is provided with a first conductive structure electrically connected with the accompanying door opening and closing mechanism.

The moving device is provided with a second interfacing structure which can be interfaced and matched with the first interfacing structure.

The second interfacing structure is provided with a second conductive structure which can contact the first conductive structure for conducting electricity.

The transfer robot is further configured to supply power to the accompanying door opening and closing mechanism in response to the first conductive structure being in contact with the second conductive structure for conducting electricity.

Further, the first interfacing structure is provided with a first gas guide structure communicated with the temporary storage space.

The second interfacing structure is provided with a second gas guide structure which can be interfaced and communicated with the first gas guide structure.

A gas supply device which is connected and communicated with the second gas guide structure is mounted on the moving device.

Further, the accompanying fixing frame includes two support plates which are symmetrically arranged and spaced apart.

Limiting protrusions which can contact and abut against tops of the respective support plates are respectively provided at two side surfaces of the accompanying device.

Further, a floating correction module is provided in the accompanying fixing frame.

The floating correction module is configured to correct a position of the moving device or the forking device extending into the accompanying fixing frame such that the first forking positioning structures directly face the respective second forking positioning structures.

Further, an anticorrosion liner is provided in the temporary storage space.

Further, at least two end effectors are provided.

One of the at least two end effectors is configured to grasp the semiconductor sample.

The other one of the at least two end effectors is configured to grasp the chemical tank.

The end effectors are detachably connected with the mechanical arm device through a joint assembly.

The accompanying device is provided with placing workstations for placing the end effectors.

Further, a sample carrying mechanism is mounted below the sample feeding and discharging port on the wet-processing equipment for carrying a semiconductor material to be fed into the sample feeding and discharging port or a semiconductor material discharged from the sample feeding and discharging port.

Further, the sample carrying mechanism includes a carrying plate and a sample carrying driving assembly.

The carrying plate is rotatably mounted on the wet-processing equipment.

The sample carrying driving assembly is mounted on the wet-processing equipment and connected with the carrying plate for driving the carrying plate to rotate.

Further, a chemical carrying mechanism is mounted at a position of a liquid storage cavity in the wet-processing equipment for carrying the chemical tank.

The chemical carrying mechanism includes a carrying seat, a chemical carrying driving assembly, and a liquid taking member.

The carrying seat is configured to carry the chemical tank.

The chemical carrying driving assembly is connected to the carrying seat for driving the carrying seat to extend out of or retract into the liquid storage cavity.

The liquid taking member is detachably mounted on the chemical tank.

Further, the liquid taking member includes a liquid taking pipe and a liquid taking cover.

The liquid taking pipe can extend into the chemical tank through a chemical port of the chemical tank.

The liquid taking cover is sleeved on the liquid taking pipe and can be matched with the chemical port for sealing the chemical port.

A fixing member is vertically mounted on the carrying seat for fixing a liquid taking member to be mounted.

The fixing member is a hollow pole structure configured for movable insertion of the liquid taking pipe.

Further, the sample supplying and storing apparatus includes a main body and a sample displacing device.

A sample chamber is provided in the main body.

A first loading and unloading workstation, a second loading and unloading workstation, a first temporary storage workstation and a second temporary storage workstation are provided at a bottom of the sample chamber.

A first loading and unloading port communicating the sample chamber with an outside of the clean space is provided on the main body at a position corresponding to the first loading and unloading workstation.

The first loading and unloading port is provided with a first door which can be opened and closed.

A second loading and unloading port communicating the sample chamber with the clean space is provided on the main body at a position corresponding to the second loading and unloading workstation.

The second loading and unloading port is provided with a second door which can be opened and closed.

The sample displacing device is mounted in the sample chamber for moving the semiconductor sample between the first loading and unloading workstation, the second loading and unloading workstation, the first temporary storage workstation and the second temporary storage workstation.

Further, a human-machine interaction device which is communicatively connected with the control apparatus and extends out of the clean space is mounted on the main body at one side of the first loading and unloading port.

Further, the chemical supplying and storing apparatus includes a chemical buffer box.

A buffer chamber for storing a chemical tank to be loaded or a replaced chemical tank is provided within the chemical buffer box.

The chemical buffer box is provided with a buffer opening.

A buffer door which can be opened and closed is provided on the buffer opening.

Further, a floor of the clean space is divided from outside to inside into an outer annular region, an inner annular region, and a central annular region located within the inner annular region.

The wet-processing equipment is arranged in the outer annular region or the central annular region.

The sample supplying and storing apparatus and the chemical supplying and storing apparatus are arranged in the outer annular region.

Further, the mechanical arm device is a cooperative mechanical arm.

Further, the moving device is an Automated Guided Vehicle (AGV).

It can be seen from above technical schemes that the wet-processing dark laboratory for scientific research designed in the present disclosure enables 24/7 experiments conduction without the need for human presence through cooperation of the transfer robot, the sample supplying and storing apparatus, the chemical supplying and storing apparatus, the control apparatus, and the wet-processing equipment, which realizes the dark laboratory, and has following beneficial effects.

1. Scheduling can be automatically made according to a work order input by an experimenter, and automatic circulation of semiconductor samples, automatic replacement of chemical tanks, automatic processing of semiconductor samples, automatic collection and analysis of experimental data, etc., can be carried out according to the scheduling, which significantly improves efficiency of scientific research and apparatus utilization.

2. There is no need for the experimenter to contact the chemical, thus effectively ensuring safety of the experimenter.

3. Waste of chemicals and samples caused by instability of manual operations of traditional experimenters and damage to apparatuses caused by mis-operation can be avoided, effectively reducing experimental cost.

4. An experimental process of semiconductor materials is automated, which improves stability and accuracy of tests, thus improving reliability of experimental results.

5. The dark laboratory is automatic and unattended, which improves laboratory management.

6. The accompanying device is designed to follow movement of the moving device, which can realize transfer of multiple semiconductor samples or multiple chemical tanks at one time, thus reducing reciprocal pickups and further improving the efficiency.

7. It has great significance in promoting development of scientific research and technology, improves research and development efficiency of semiconductor technology and accelerates the research and development progress.

BRIEF DESCRIPTION OF DRAWINGS

To illustrate the embodiments of the present disclosure or the technical scheme in the existing technology more clearly, the drawings required in the description of the embodiments or the existing technology will be briefly introduced below. Obviously, the drawings in the following description are only some embodiments of the present disclosure, and other drawings can be obtained according to these drawings by those having ordinary skills in the art without creative labor.

6

Figure 8:
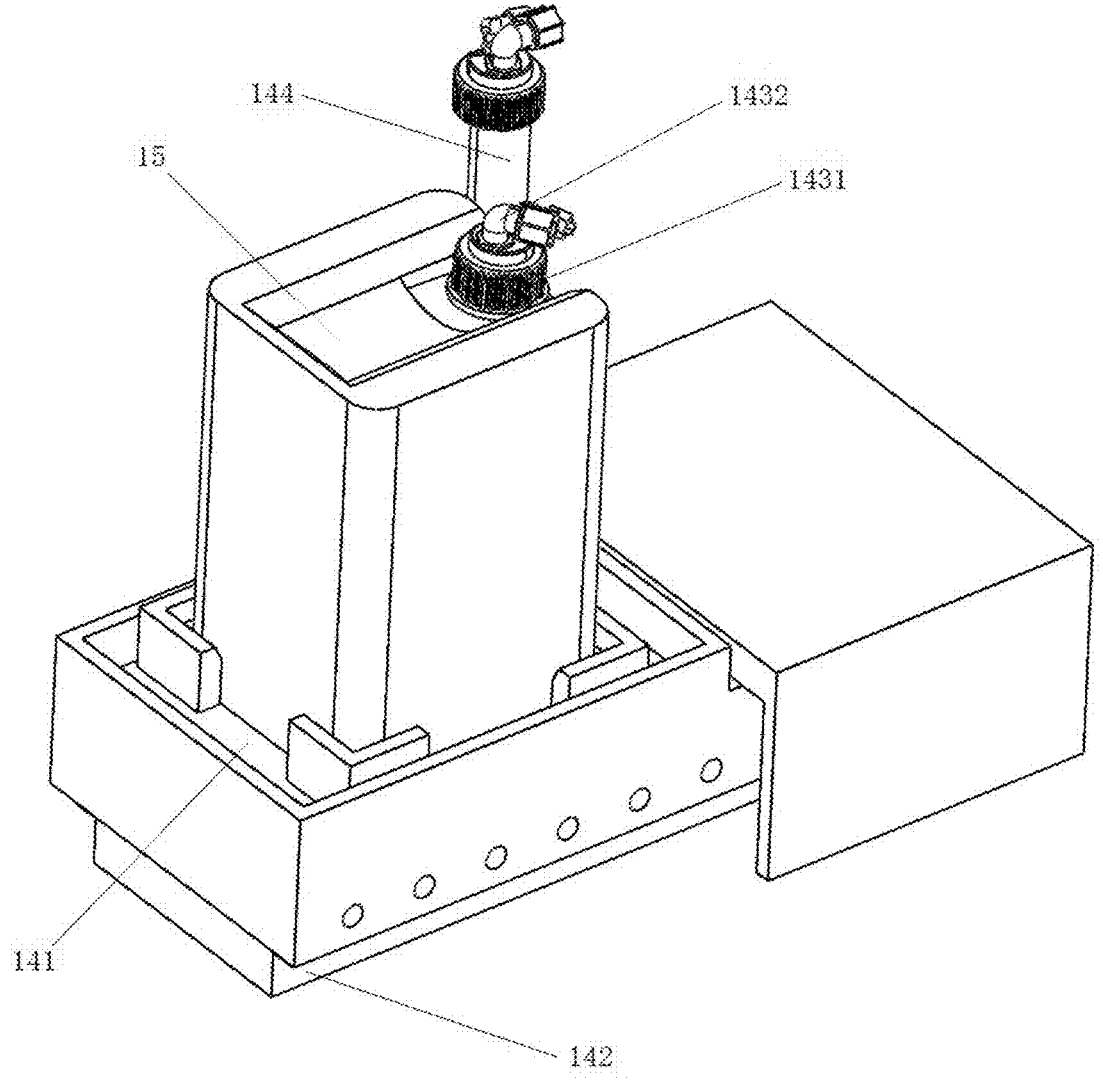
Figure 9:
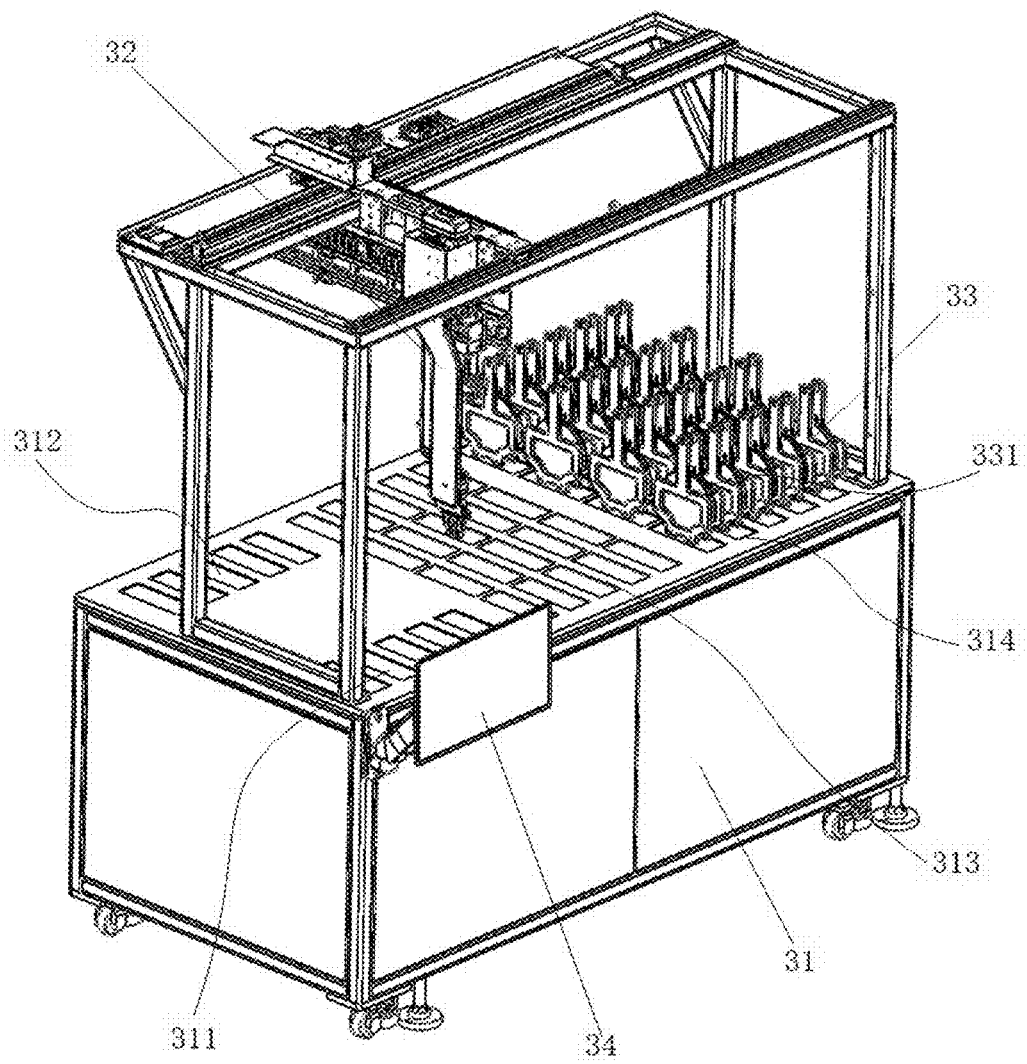
Figure 10:
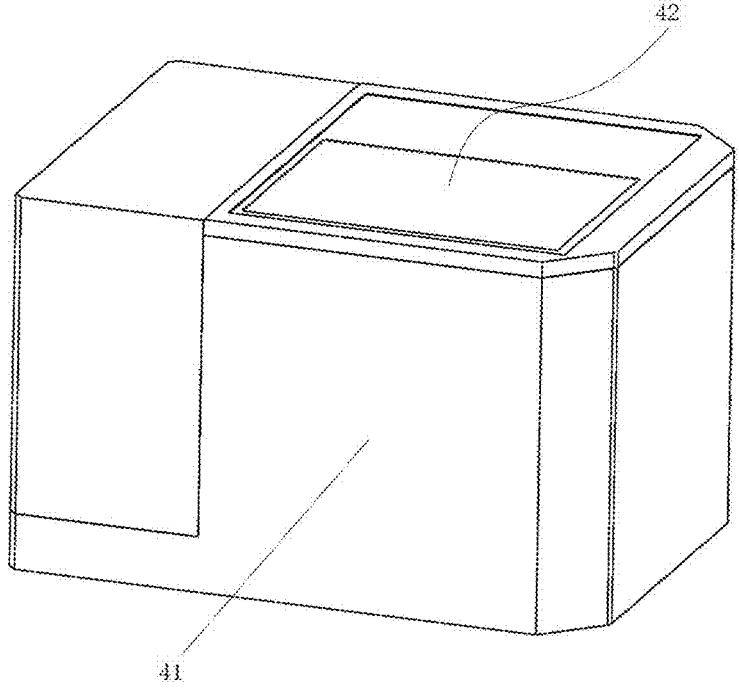

FIG. 8 is a perspective view of a chemical carrying mechanism with a chemical tank of the wet-processing dark laboratory for scientific research according to the present disclosure;

FIG. 9 is a perspective view of a sample supplying and storing apparatus of the wet-processing dark laboratory for scientific research according to the present disclosure with part of a main body of the apparatus not shown; and FIG. 10 is a perspective view of a chemical buffer box of the wet-processing dark laboratory for scientific research according to the present disclosure.

Reference numbers: 1. Wet-processing equipment; 11. Sample Feeding and Discharging Port; 12. Sample Loading Mechanism; 121. Carrying plate; 122. Sample Carrying Driving Assembly; 13. Liquid Storage Cavity; 14. Chemical Carrying Mechanism; 141. Carrying Seat; 142. Chemical Carrying Driving Assembly; 143. Liquid Taking Member; 1431. Liquid Taking Cover; 1432. Liquid Taking Pipe; 1433. Liquid Taking Joint; 144. Fixing Member; 15. Chemical Tank; 151. Chemical Port; 2. Transfer Robot; 21. Moving Device; 211. Second Interfacing Structure; 22. Mechanical Arm Device; 23. End Effector; 24. Accompanying Device; 241. Second Forking Positioning Structure; 242. Accompanying Door Opening and Closing Mechanism; 243. Limiting Projection; 244. Placing Workstation; 245. Extension Boss; 25. Joint Assembly; 251. First Joint; 252. Second Joint; 26. Accompanying Fixing Frame; 261. Support Plate; 27. Forking Device; 271. Forking Lifting Device; 272. Forking plate; 2721. First forking positioning structure; 28. Fixture Plate; 3. Sample Supplying and Storing Apparatus; 31. Main Body; 311. First Loading and Unloading Workstation; 312. Second Loading and Unloading Workstation; 313. First Temporary Storage Workstation; 314. Second Temporary Storage Workstation; 32. Sample Displacing Device; 33. Cassette; 331. Semiconductor Material; 34. Human-machine Interaction Device; 4. Chemical Supplying and Storing Apparatus; 41. Chemical Buffer Box; 42. Buffer Door; 5. Control Apparatus; 61. Outer Annular Region; 62. Inner Annular Region; 63. Central Annular Region.

DETAILED DESCRIPTION

The technical scheme of the present disclosure will be described below clearly and completely in conjunction with the accompanying drawings, and it is obvious that the embodiments described below are a part of the embodiments of the present disclosure, but not all of the embodiments. On a basis of the embodiments in the present disclosure, all other embodiments obtained by those having ordinary skills in the art without creative effort are within the protection scope of the present disclosure.

In the description of the embodiments of the present disclosure, it should be understood that the orientation or positional relationships indicated by the terms "center", "upper", "lower", "left", "right", "vertical", "horizontal", "inner" and "outer" are based on the orientation or positional relationship shown in the drawings, and are used only for ease and brevity of illustration and description, rather than indicating or implying that the mentioned apparatus or element must have a particular orientation or must be constructed and operated in a particular orientation. Therefore, such terms should not be construed as limiting of the present disclosure. In addition, the terms "first", "second", "third" and the like merely used for description, and are not intended to indicate or imply relative importance.

In the description of the embodiments of the present disclosure, it should be noted that unless otherwise specified and limited, the terms "mounted", "coupled" and "connected" should be understood in a broad sense, for example, they may be fixed connections, detachable connections, or integral connections; may be mechanical connections, or electric connections; may be direct connections, or indirect connections via intervening structures; may be inner communications or interaction of two elements. The specific meaning of the above terms within the present disclosure may be understood by those having ordinary skills in the art according to particular circumstances.

Embodiments of the present disclosure disclose a wet-processing dark laboratory for scientific research.

Figure 1:
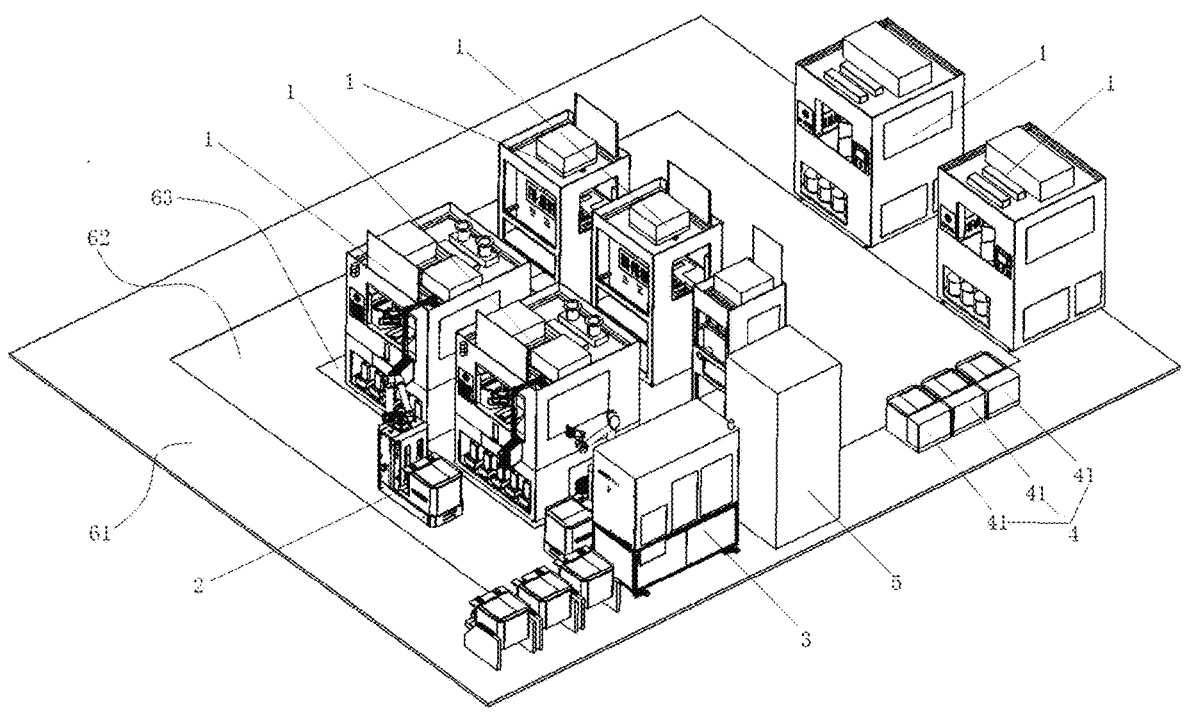
FIG. 1 is a perspective view of a wet-processing dark laboratory for scientific research without a laboratory body according to the present disclosure.
Figure 2:
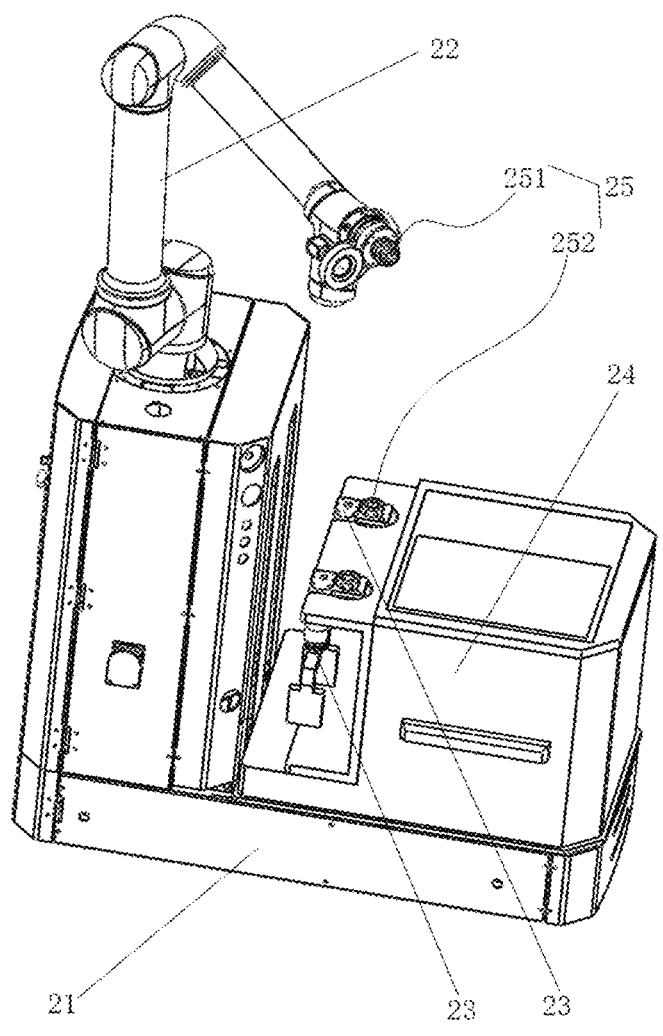
FIG. 2 is a perspective view of a transfer robot of the wet-processing dark laboratory for scientific research according to the present disclosure.

Referring to FIG. 1 and FIG. 2, the wet-processing dark laboratory for scientific research according to an embodiment of the present disclosure includes:

a laboratory body (not shown), a wet-processing equipment 1, a transfer robot 2, a sample supplying and storing apparatus 3, a chemical supplying and storing apparatus 4, and a control apparatus 5.

The laboratory body is configured to provide a clean space. The laboratory body can be constructed of fireproof and explosion-proof plates and equipped with apparatuses such as fire prevention and air purification apparatuses to ensure cleanliness and safety of the clean space. Appropriate changes and designs can be made by those having ordinary skills in the art, which is not limited herein.

The wet-processing equipment 1 is arranged in the clean space for processing semiconductor samples. In the present disclosure, a plurality of wet-processing equipments 1 may be provided as required, which are of different types. Taking the plurality of wet-processing equipment 1 as an example, they may include one organic wet-processing equipment, two oxide cleaning equipments, one metal etching equipment, one KOH cleaning equipment, one HF cleaning equipment, one mask cleaning equipment, and so on, which may be selected by those having ordinary skills in the art as required and is not limited herein. It should be noted that the equipment are designed based on or adopt the research-oriented fully automated wet etching system and equipment disclosed in Chinese patent No. CN118053795B, which will not be detailed described herein.

In the design of a plurality of wet-processing equipments 1, processes may be interconnected and ordered in a sequence.

There are few continuous processes in wet experiments which are generally carried out with dry/lithography/film coating processes step by step. Therefore, when a plurality of equipments are interconnected with each other, they need to cooperate with other apparatuses, for example:

an organic wet-processing equipment/oxide cleaning equipment No. 2 are used to wash a clean wafer surface (for a short time, only a few minutes), the organic wet-processing equipment/oxide cleaning equipment No. 2/HF cleaning equipment are used to perform photolithography/dry etching and other processes, and the KOH cleaning equipment is used to remove photoresist (for a long or short time, ranging from 10 min to 2 hours) by wet etching (for about 8 hours).

In the design of a plurality of wet-processing equipments 1, the sequence of using the wet-processing equipments 1 is reasonably planned according to a process sequence, reservation time, process durations, sample grasping time, etc., such that multiple groups of experiments can be carried out simultaneously and orderly.

A plurality of groups of experiments are carried out on corresponding wet-processing equipment 1 according to the planned sequence/experiment types.

The sample supplying and storing apparatus 3 is arranged in the clean space for providing a semiconductor sample to be processed and store a processed semiconductor sample.

The chemical supplying and storing apparatus 4 is arranged in the clean space for providing a chemical tank 15 to be replaced and storing a replaced chemical tank 15.

The transfer robot 2 is installed in the clean space for transferring semiconductor samples and/or the chemical tank 15 between the wet-processing equipment 1, the transfer robot 2, the sample supplying and storing apparatus 3 and the chemical supplying and storing apparatus 4.

The transfer robot 2 includes a moving device 21, a mechanical arm device 22, at least one end effector 23, and an accompanying device 24.

The accompanying device 24 can follow movement of the moving device 21 and provide a temporary storage space. The temporary storage space can be used to temporarily store a semiconductor sample to be loaded, a processed semiconductor sample, the chemical tank 15 to be replaced or the replaced chemical tank 15.

The mechanical arm device 22 is mounted on the moving device 21. The at least one end effector 23 is mounted on the mechanical arm device 22 for grasping the semiconductor sample and/or the chemical tank 15. The end effector 23 may be an existing mechanical gripping jaw, which can grasp a cassette 33 or a fixture rack loaded with semiconductor samples, and can also be used to grasp the chemical tank 15 and a cover of the chemical tank 15 and unscrew or tighten the cover under action of a rotating mechanism at an end of the mechanical arm, which is not specifically limited herein.

The control apparatus 5 is communicatively connected with the wet-processing equipment 1, the transfer robot 2, the sample supplying and storing apparatus 3, and the chemical supplying and storing apparatus 4.

The wet-processing dark laboratory for scientific research designed in the present disclosure enables 24/7 experiments conduction without the need for human presence through cooperation of the transfer robot 2, the sample supplying and storing apparatus 3, the chemical supplying and storing apparatus 4, the control apparatus 5, and the wet-processing equipment 1, which realizes the dark laboratory, and has following beneficial effects.

1. Scheduling can be automatically made according to a work order input by an experimenter, and automatic circulation of semiconductor samples, automatic replacement of chemical tanks 15, automatic processing of semiconductor samples, automatic collection and analysis of experimental data, etc., can be carried out according to the scheduling, which significantly improves efficiency of scientific research and apparatus utilization.

2. There is no need for the experimenter to contact the chemical, thus effectively ensuring safety of the experimenter.

3. Waste of chemicals and samples caused by instability of manual operations of traditional experimenters and damage to apparatuses caused by mis-operation can be avoided, effectively reducing experimental cost.

4. The experimental process of semiconductor materials 331 is automated, which improves stability and accuracy of tests, thus improving reliability of experimental results.

5. The dark laboratory is automatic and unattended, which improves laboratory management.

6. The accompanying device 24 is designed to follow movement of the moving device 21, which can realize the transfer of multiple semiconductor samples or multiple chemical tanks 15 at one time, thus reducing reciprocal pickups and further improving the efficiency.

7. It has great significance in promoting development of scientific research and technology, improves research and development efficiency of semiconductor technology and accelerates the research and development progress.

The above is a first embodiment of the wet-processing dark laboratory for scientific research provided by the present disclosure, and the following is a second embodiment of the wet-processing dark laboratory for scientific research provided by the present disclosure. Reference may made to FIGS. 1 to 10 for details.

The scheme of the second embodiment is designed based on the first embodiment as described above.

Further, to improve convenience of use, different accompanying devices 24 may be selected for use as required, and the accompanying device 24 is designed to be detachably connected with the moving device 21. Specifically, different accompanying devices 24 are designed to correspond to different wet-processing equipment 1, and when a wet-processing equipment 1 needs to be loaded and unloaded or needs chemical replacement, a corresponding accompanying device may be replaced.

Figure 3:
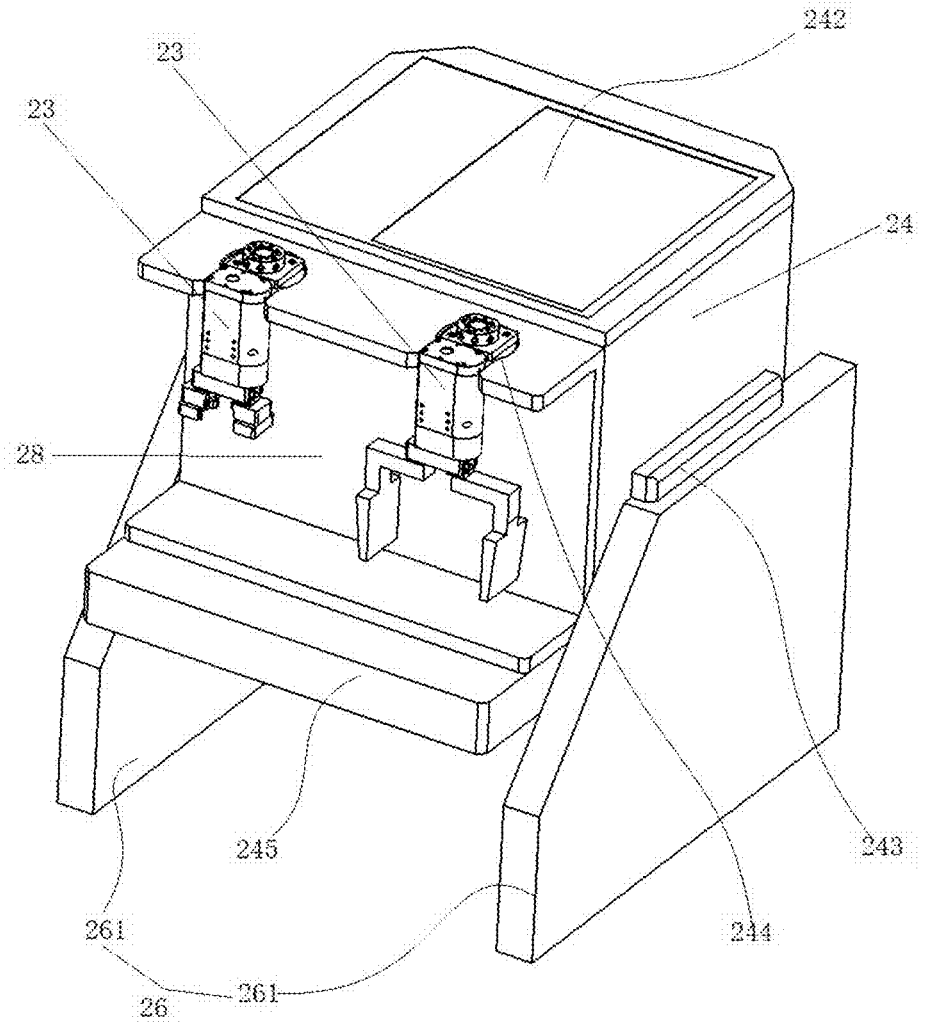
FIG. 3 is a perspective view showing cooperation between an accompanying device and an accompanying fixing frame of the wet-processing dark laboratory for scientific research according to the present disclosure.

Specifically, as shown in FIG. 3, in the present disclosure, an accompanying fixing frame 26 is provided. The accompanying fixing frame 26 is installed in the clean space for fixing the accompanying device 24.

Figure 4:
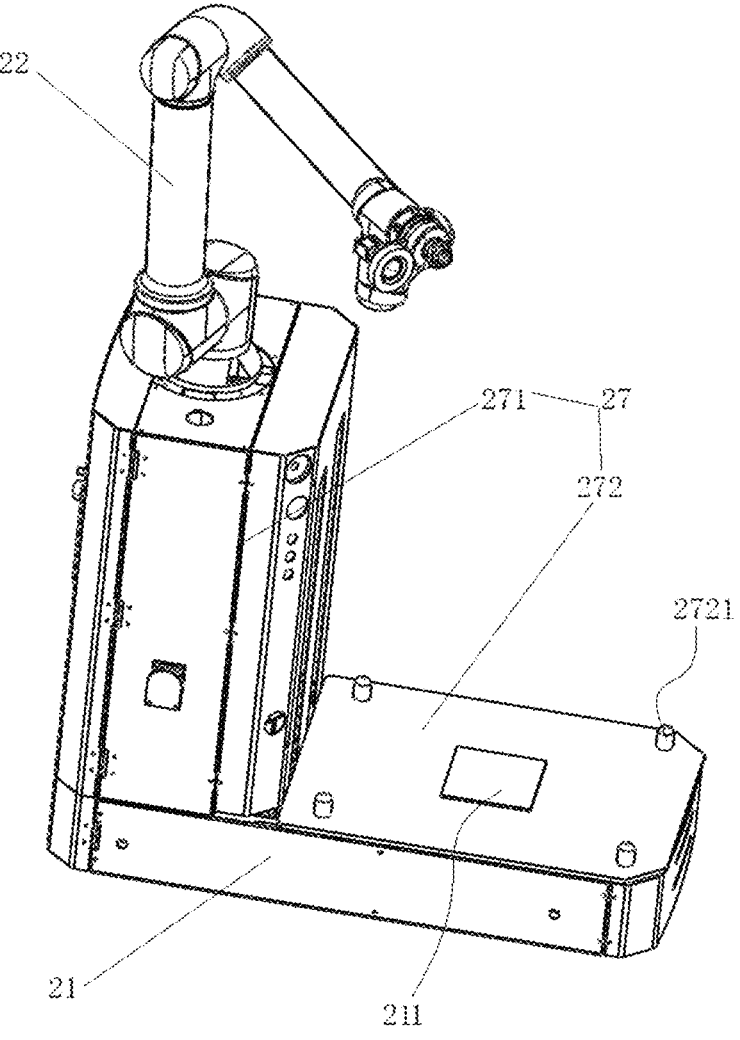
FIG. 4 is a perspective view of a transfer robot without an accompanying device of the wet-processing dark laboratory for scientific research according to the present disclosure.

As shown in FIG. 4, the transfer robot 2 further includes a forking device 27. The forking device 27 is mounted on the moving device 21 for forking the accompanying device 24 positioned on the accompanying fixing frame 26. In an embodiment, a plurality of accompanying devices 24 are provided, and a plurality of accompanying fixing frames 26 are correspondingly provided for installing and fixing the respective accompanying devices 24. When in use, an accompanying device 24 is taken using the forking device 27 to realize connection of the accompanying device 24 with the moving device 21; and when not in use, the accompanying device 24 may be placed back on the accompanying fixing frame 26.

Further, as shown in FIG. 4, for the design of the forking device 27, it includes a forking lifting device 271 and a forking plate 272.

The accompanying fixing frame 26 is provided with an avoidance cavity below the accompanying device 24 for the forking plate 272 to extend into, so as to ensure that the moving device 21 can carry the forking plate 272 to move below a corresponding accompanying device 24.

The forking lifting device 271 is mounted at a top of the moving device 21, with a driving end being connected to the forking plate 272 for driving the forking plate 272 to move up and down, so as to fork the accompanying device 24 off from the accompanying fixing frame 26 or fork the accompanying device 24 back to the accompanying fixing frame 26.

During pickup, the moving device 21 is driven into the avoidance cavity and the forking plate 272 is caused to be located directly below the corresponding accompanying device 24, then the forking lifting device 271 drives the forking plate 272 to move upwards to lift the accompanying device 24, and then the moving device 21 exits from the avoidance cavity to allow the accompanying device 24 to be forked off the accompanying fixing frame 26, and then the forking lifting device 271 drives the forking plate 272 to descend to its initial position.

During put back, the forking lifting device 271 drives the forking plate 272 to raise a certain height, then the moving device 21 is driven into the avoidance cavity and the forking plate 272 is located above the corresponding accompanying fixing frame 26, and then the forking lifting device 271 drives the forking plate 272 to lower to a certain height to put the accompanying device 24 back on the accompanying fixing frame 26.

In the present disclosure, the mechanical arm device 22 may be mounted at a top of the forking lifting device 271, and the forking lifting device 271 may be a screw sliding table or the like, which is not limited as long as lifting control requirements can be met.

Figure 5:
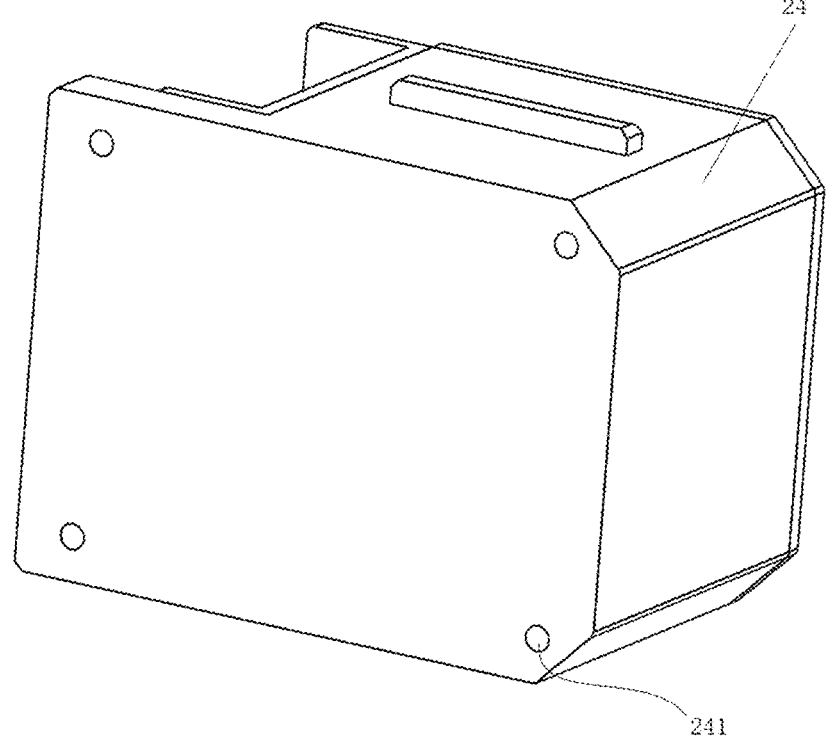
FIG. 5 is a first perspective view of an accompanying device of the wet-processing dark laboratory for scientific research according to the present disclosure.

Further, as shown in FIG. 4 and FIG. 5, in order to realize accurate forking and reliable connection between the accompanying device 24 and the forking plate 272 after forking, a plurality of first forking positioning structures 2721 are provided at a top of the forking plate 272, and correspondingly, a plurality of second forking positioning structures 241 which are in one-to-one matching with the plurality of first forking positioning structures 2721 for positioning are provided at a bottom of the accompanying device 24.

The first forking positioning structure 2721 may be a positioning protrusion, and there may be four positioning protrusions. Correspondingly, the second forking positioning structure 241 may be a positioning groove, a number of which is the same as a number of positioning protrusions, based on which appropriate changes and designs may be made by those having ordinary skills in the art, which is not limited herein.

To meet power supply for an electric door mechanism, the accompanying device 24 is configured with a supply battery, and correspondingly, the accompanying fixing frame 26 may be configured with a charging device to charge the battery in the fixed accompanying device 24 in a wireless charging or contact charging manner. Of course, the accompanying door opening and closing mechanism 242 can also be a manual door mechanism, and the mechanical arm device 22 drives the end effector 23 to simulate a human hand to open or close a door.

Of course, the electric door mechanism may also be supplied with power by the transfer robot 2. Specifically, a first interfacing structure (not shown) is provided at the bottom of the accompanying device 24.

The first interfacing structure is provided with a first conductive structure electrically connected with the accompanying door opening and closing mechanism 242. The first conductive structure may be a contact conductive pin or other conductive joint structures, which is not limited herein.

The moving device 21 is provided with a second interfacing structure 211 which can be interfaced and matched with the first interfacing structure, and the first interfacing structure and the second interfacing structure 211 may be mutually embedded, similar to the above matching design of projection and groove, which will not be detailed herein. In addition, to prevent up-and-down movement of the forking plate 272 from being affected, the forking plate 272 is provided with an avoidance port for the second interfacing structure 211 to movably extend out of.

The second interfacing structure 211 is provided with a second conductive structure which can contact the first conductive structure for conducting electricity. The transfer robot 2 is also configured to supply power to the accompanying door opening and closing mechanism 242 when the first conductive structure is in contact with the second conductive structure for conducting electricity. Specifically, the forking plate 272 rises to fork the accompanying device 24 from the accompanying fixing frame 26, then exits from the accompanying fixing frame 26, and then descends to its initial position. In this case, the first interfacing structure of the accompanying device 24 on the forking plate 272 is interfaced with the second interfacing structure 211, and the first conductive structure is in contact with the second conductive structure for conducting electricity. Then, a power management module on the transfer robot 2 is controlled to supply power to the accompanying door opening and closing mechanism 242.

Further, the first interfacing structure may be provided with a first gas guide structure communicated with the temporary storage space, the second interfacing structure 211 is provided with a second gas guide structure which can be interfaced and communicated with the first gas guide structure, and the first gas guide structure and the second gas guide structure may be gas joints which are engaged with each other.

The moving device 21 is provided with a gas supply device (not shown) which is connected and communicated with the second gas guide structure. The gas supply device may be a gas pump device, which can supply gas to or extract gas from the temporary storage space. The gas supply device may be provided to have following applications:

1. supplying gas to the temporary storage space (the gas supply device may be configured with a filter device to filter gas supplied to the temporary storage space), such that the temporary storage space can be kept in a slightly positive pressure state and even if the temporary storage space is in an open state, overflow gas due to the slightly positive pressure can be used to prevent external dust from entering the temporary storage space and maintain cleanliness of the temporary storage space;

2. purging or sucking the temporary storage space to clean the temporary storage space; and 3. serving as a power source to control the accompanying door opening and closing mechanism 242 when the accompanying door opening and closing mechanism 242 is pneumatically driven.

Further, to accurately align the first forking positioning structure 2721 with the second forking positioning structure 241, so as to ensure that the first forking positioning structure 2721 is well interfaced with the second forking positioning structure 241 subsequently, and to accurately fork the accompanying device 24, a floating correction module (not shown in the figure) may be provided in the accompanying fixing frame 26.

The floating correction module is configured to correct a position of the moving device 21 or the forking device 27 extending into the accompanying fixing frame 26 such that the first forking positioning structures 2721 directly face the respective second forking positioning structures 241.

The floating correction module may be designed to include a first direction corrector and a second direction corrector (the first direction corrector and the second direction corrector each include a retractor and a push plate, and the retractor is connected with the push plate to drive the push plate to move, so as to push the moving device 21 which has extended into the accompanying fixing frame 26 to move to complete correction). There are two first direction correctors, which are symmetrically arranged along a direction perpendicular to a direction in which the moving device 21 extends into and exits from the accompanying fixing frame 26. It can be understood that when the moving device 21 extends into the accompanying fixing frame 26, the two first direction correctors are located on two sides of the moving device 21, and a position of the moving device 21 in a first direction is corrected through telescopic movement of the first direction correctors. The second direction corrector is arranged along the direction in which the moving device 21 extends into and exits from the accompanying fixing frame 26. It can be understood that when the moving device 21 extends into the accompanying fixing frame 26, the second direction corrector is located at a front end of the moving device 21, and a position of the moving device 21 in a second direction is corrected through telescopic movement of the second direction corrector.

To better realize accurate positioning and matching, a positioning guide groove with a larger size may be designed around the designed positioning groove, which has an inclined guiding plane, so as to guide the positioning protrusion into the positioning groove and realize physical positioning. Of course, a positioning sensor, such as a scanner, may be provided at the bottom of the accompanying device 24, and an inductive structure, such as a tag code, which can be sensed by the positioning sensor, may be provided on the forking plate 272, to realize inductively positioning. Appropriate changes and designs may be made by those having ordinary skills in the art on this basis, which is not limited herein.

Further, to avoid the temporary storage space from being corroded by the chemical, an anticorrosion liner is provided in the temporary storage space, which may be made of materials such as PFA, Teflon, PP, etc., and is not specifically limited herein.

Further, as shown in FIG. 3, the accompanying device 24 has a box-like structure, in which an accommodating cavity is provided to form the temporary storage space. The accompanying door opening and closing mechanism 242 for controlling opening and closing of the accommodating cavity is mounted on the accompanying device 24. The accompanying door opening and closing mechanism 242 is an electric door mechanism, which is controlled by the control apparatus 5 to realize controlling of electric opening and closing, such as a flip-up electric door opening and closing mechanism, which may be designed with reference to or can directly adopt existing electric doors, which is not repeatedly described.

Further, as shown in FIG. 3, for the design of the accompanying fixing frame 26, it may include two support plates 261 which are symmetrically arranged and spaced apart. Correspondingly, limiting protrusions 243 which can contact and abut against tops of the two support plates 261 in one-to-one correspondence are respectively provided at two side surfaces of the accompanying device 24. In terms of contact charging design, charging contacts may be provided at bottoms of the limiting protrusions 243 and tops of the support plates 261, so as to charge the battery inside the accompanying device 24 through contact.

Further, as shown in FIG. 3, there are at least two end effectors 23, of which one end effector 23 is used to grasp the semiconductor sample and the other end effector 23 is used to grasp the chemical tank 15. Different end effectors 23 can be used to perform different actions, thus enabling a more targeted design of end effectors 23. For example, an opening degree of a gripping jaw mechanism of an end effector 23 for grasping the cassette 33 carrying the semiconductor material 331 may be designed to be small, while an opening degree of a gripping jaw mechanism for grasping the chemical tank 15 may be designed to be large, which is not specifically limited herein.

In addition, the end effector 23 may also be an overhaul actuator, and the mechanical arm device 22 drives the end effector 23 serving as the overhaul actuator to overhaul a corresponding apparatus, to realize an automatic overhaul operation. Of course, there is no limitation thereto, and the end effector 23 may be other actuators, such as a cleaning mechanism for realizing the cleaning operation, which is not specifically limited herein.

As shown in FIG. 2, the end effector 23 may be designed to be detachably connected with the mechanical arm device 22 through a joint assembly 25. The joint assembly 25 is an existing quick connector, which includes a first joint 251 fixed at an end of the mechanical arm device 22 and a second joint 252 fixed on the end effector 23, so as to realize quick connection and disassembly.

As shown in FIG. 3, in order to carry the end effector 23 during accompanying moving and facilitate replacement of the end effector 23, the accompanying device 24 is provided with a placing workstation 244 for placement of the end effector 23. The placing workstation 244 may be of a clamping groove structure for the end effector 23 to be clamped into, and the second joint 252 may be arranged at an outer side surface of the end effector 23 and is fixedly connected with the end effector 23 through a right-angle connecting plate. Taking the placing workstation 244 being a clamping groove as an example, a step is further provided for supporting the second joint 252 connected with the clamped end effector 23, and the second joint 252 is arranged at one side of the end effector 23, which reduces a length of the end effector 23 while forming a convex structure at the side surface of the end effector 23, so as to facilitate contacting with the step to realize rapid fixation. This design is simple in structure and facilitates picking and placing of the end effector 23, and is also beneficial to improving the efficiency, which is not specifically limited herein.

In order to realize that the placing workstation 244 on an accompanying device 24 may be replaced as required, an extension boss 245 is provided at a bottom of a side surface of the accompanying device, and a right-angle installation area can be formed between the extension boss 245 and the side surface of the accompanying device 24. The extension boss 245 is provided with a detachable fixture plate 28 which may be in a form of a right open square frame, with a lower part attached to the extension boss 245 and a side part attached to a side surface of the accompanying device 24 to achieve firm mounting and fixation. A placing workstation 244 required is provided at an upper part of the fixture plate 28, and the fixture plate 28 may be connected to the accompanying device 24 through fasteners such as screws and bolts, which is not specifically limited herein.

Further, since processing time of the semiconductor material 331 by the wet-processing equipment 1 is different according to different processing requirements, although the control apparatus 5 can timely control the transfer robot 2 to pick up a processed semiconductor material 331after acquiring the processing time of the semiconductor material 331 by the wet-processing equipment 1, if the transfer robot is moving other semiconductor materials 331 or replacing the chemical tank 15 at this time, it needs to stop a current operation of the transfer robot 2 or leave the wet-processing equipment 1 in a waiting state, which may affect use efficiency of the transfer robot 2 or the wet-processing equipment 1. In order to solve above problems, the following is proposed.

Figure 6:
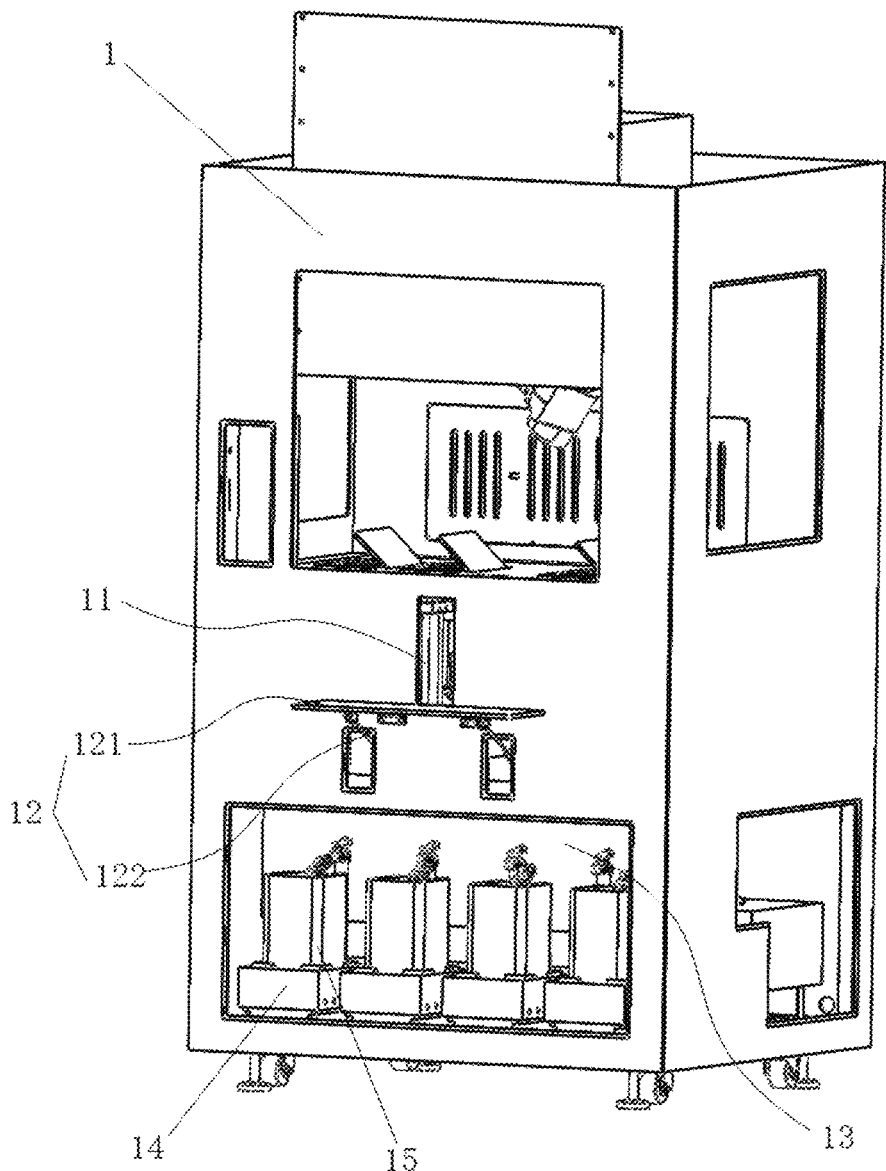
FIG. 6 is a perspective view of a wet-processing equipment of the wet-processing dark laboratory for scientific research according to the present disclosure.

As shown in FIG. 6, the wet-processing equipment 1 is improved in the present disclosure, and a sample carrying mechanism 12 is mounted below the sample feeding and discharging port 11 on the wet-processing equipment for carrying a semiconductor material 331 to be fed into the sample feeding and discharging port 11 or a semiconductor material 331 discharged from the sample feeding and discharging port 11. When the wet-processing equipment 1 finishes processing of the semiconductor material 331, it can directly push the semiconductor material 331 out of the sample feeding and discharging port 11 into the sample carrying mechanism 12 for picking up, and then the sample feeding and discharging port 11 may be closed and other processes can be continued without keeping the feeding and discharging port open or entering a suspended state. When the transfer robot 2 loads a semiconductor material 331, the transfer robot 2 may first transfer the semiconductor material 331 to the sample carrying mechanism 12, and then performs a next process. When the control apparatus 5 informs that the wet-processing equipment 1 is available, the transfer robot 2 can return to pick the semiconductor material 331 output from the wet-processing equipment 1 and put the semiconductor material 331 on the sample carrying mechanism 12 in place for sending to the wet-processing equipment 1. Because the semiconductor material 331 to be processed is placed on the sample carrying mechanism 12 previously, more positions are left in the temporary storage space of the accompanying device 24, which facilitates the collection of the processed semiconductor sample, and further improves use efficiency of the apparatus.

Further, as shown in FIG. 6, the sample carrying mechanism 12 is designed to include a carrying plate 121 and a sample carrying driving assembly 122.

The carrying plate 121 is rotatably mounted on the wet-processing equipment 1, and the sample carrying driving assembly 122 is mounted on the wet-processing equipment 1 and connected with the carrying plate 121 for driving the carrying plate 121 to rotate. The sample carrying driving assembly 122 may be an electric push rod, and there may be two electric push rods. One end of the electric push rod is hinged with the wet-processing equipment 1, and the other end of the electric push rod is hinged with a bottom of the carrying plate 121, so as to drive the carrying plate 121 to rotate through telescopic movement. When the carrying plate 121 needs to be used, the sample carrying driving assembly 122 is controlled to extend out and move to turn over the carrying plate 121 to a horizontal state, while when it is not needed, the sample carrying driving assembly 122 is controlled to retract and move to turn over the carrying plate 121 to a vertical state.

Further, as shown in FIG. 6, to better realize replacement of the chemical tank 15, the wet-processing equipment 1 is improved in the present disclosure, and a chemical carrying mechanism 14 is mounted at a position of the liquid storage cavity 13 on the wet-processing equipment 1 for carrying the chemical tank 15.

Figure 7:
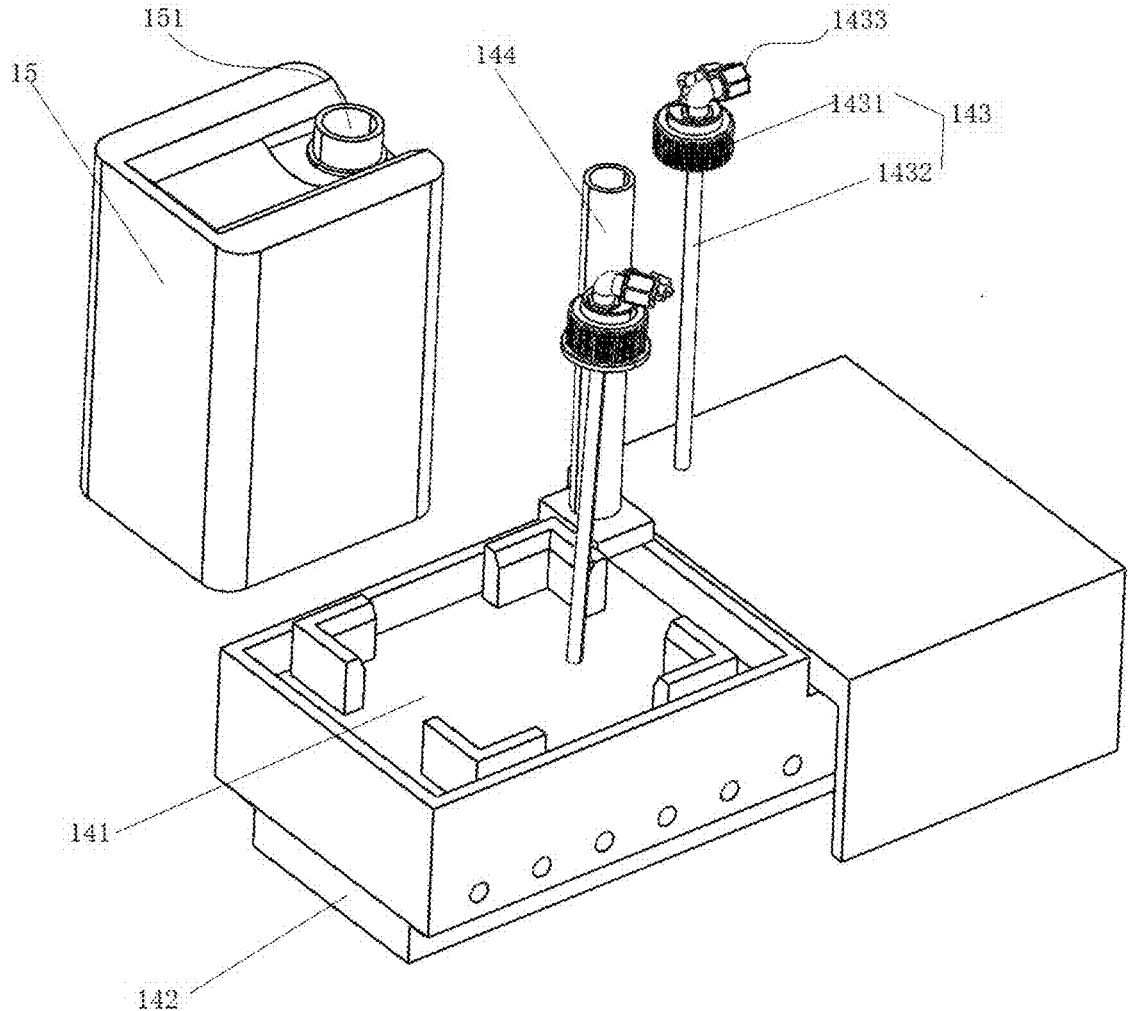
FIG. 7 is a schematic exploded view of a chemical carrying mechanism with a chemical tank of the wet-processing dark laboratory for scientific research according to the present disclosure.

The liquid storage cavity 13 is of a non-closed design. As shown in FIGS. 7 and 8, the chemical carrying mechanism 14 includes a carrying seat 141, a chemical carrying driving assembly 142, and a liquid taking member 143.

The carrying seat 141 is configured to carry the chemical tank 15, and is provided with a positioning installation groove for positioning and installing the chemical tank 15.

The chemical carrying driving assembly 142 is connected to the carrying seat 141 for driving the carrying seat 141 to extend out of or retract into the liquid storage cavity 13. The chemical carrying driving assembly 142 may be an existing multi-stage telescopic shaft or multi-stage chain transmission telescopic mechanism, which will not be detailed herein.

The liquid taking member 143 is detachably mounted on the chemical tank 15.

During replacement, the chemical carrying driving assembly 142 firstly extends a chemical tank 15 to be replaced out of the liquid storage cavity 13. Next, the mechanical arm device 22 drives the end effector 23 to take out the liquid taking member 143, grasp the chemical tank 15 to the temporary storage space, and then grasp a new chemical tank 15 from the temporary storage space and place it on the carrying seat 141. Then, the mechanical arm device 22 drives the end effector 23 to unscrew a cover on the new chemical tank 15, and place the liquid taking member 143 into the new chemical tank 15. After that, the chemical carrying driving assembly 142 retracts the replaced chemical tank 15 into the liquid storage cavity 13, and the liquid taking mechanism in the wet-processing equipment 1 can then be communicated with the liquid taking member 143 through a retractable flexible pipe (such as a telescopic corrugated tube). The use of the retractable flexible pipe for connection avoids affecting the disassembly and assembly of the liquid taking member 143 and movement of the carrying seat 141, so as to take chemical from the new chemical tank 15, or the mechanical arm device 22 drives the end effector 23 to grasp and connect a corresponding joint on the wet-processing equipment 1 with the liquid taking member 143.

Further, as shown in FIG. 7, the liquid taking member 143 is designed to include a liquid taking pipe 1432 and a liquid taking cover 1431.

The liquid taking pipe 1432 can extend into the chemical tank 15 through a chemical port 151 of the chemical tank 15. The liquid taking cover 1431 is sleeved on the liquid taking pipe 1432 and may be matched with the chemical port 151 to seal the chemical port 151. The liquid taking pipe 1432 is used to take liquid, while the liquid taking cover 1431 has the same function as an original cover of the chemical tank 15 and is used to seal the chemical port 151 and fix the liquid taking pipe 1432 (matching between the liquid taking cover 1431 and the chemical port 151 of the chemical tank 15 may be plug-in matching, screwed matching, etc., which is not limited herein). To facilitate communication with the liquid taking mechanism in the wet-processing equipment 1, an end of a segment of the liquid taking pipe 1432 located outside the liquid taking cover 1431 is connected with a liquid taking joint 1433. The liquid taking joint 1433 is a one-way valve joint, that is, the chemical can only be sucked from the chemical tank 15 but cannot flow back into the chemical tank 15.

After the liquid taking member 143 is taken out, to facilitate placement, a fixing member 144 is vertically mounted on the carrying seat 141 for fixing a liquid taking member 143 to be mounted. Taking the design of the liquid taking pipe 1432 and the liquid taking cover 1431 described above as an example, the fixing member 144 is designed as a hollow pole structure for movable insertion of the liquid taking pipe 1432. Because a part of the chemical may be remained in the taken-out liquid taking pipe 1432, after the liquid taking pipe 1432 is inserted into the fixing member 144, this part of chemical may be remained in the fixing member 144, causing pollution and waste. Therefore, a recovery hole (not shown) may be defined at a bottom of the fixing member 144, which may be connected to a recovery tank through a recovery pipe (which may be a telescopic corrugated tube), such that the remained chemical in the fixing member 144 can be recovered. Meanwhile, the recovery hole may also be connected to a cleaning device through a cleaning pipe, and cleaning liquid may be injected into the fixing member 144 through the cleaning device to clean the liquid taking pipe 1432.

In addition, a chemical tooling (not shown) for adapting to different sizes of chemical tanks 15 is further designed in the present disclosure, and the chemical tooling may be arranged on the carrying seat 141.

The number of chemical carrying mechanisms 14 in the present disclosure may be designed to be one or more as required, which is not specifically limited herein.

Further, in the present disclosure, a monitoring device (not shown) that can monitor the amount of chemical in the chemical tank 15 is designed. To avoid affecting replacement of the chemical tank 15, the monitoring device may be a weighing device, which is arranged on the carrying seat 141 and weighs the chemical tank 15 placed thereon. When a weight is lower than a preset value, it is considered that the amount of chemical in the chemical tank 15 has reached a warning value. In this case, a signal may be sent to the control apparatus 5 for the control apparatus 5 to control the transfer robot 2 to perform a chemical replacing operation.

The monitoring device may also be an ultrasonic level gauge or an infrared level gauge, and a transparent window (not shown) may be provided on the top of the chemical tank 15, and the monitoring device is mounted on the wet-processing equipment 1. For the transparent window mounted on the chemical tank 15 on the carrying seat 141, a liquid level in the chemical tank is detected through the transparent window, so as to monitor the amount of chemical in the chemical tank 15.

When the monitoring device monitors that the liquid level of the chemical tank 15 in use reaches the warning value, information is fed back to the control apparatus 5, and the control apparatus 5 automatically generates a chemical replacing task (in which start time of the chemical replacing task is manually specified (considering currently scheduled experimental tasks), and the system automatically calculates completion time of the chemical replacing based on the start time and standardized working hours for chemical replacing, so as to complete automatic scheduling of the chemical replacing task). During the chemical replacing, the wet-processing equipment 1 is prohibited from use, and the priority of the chemical replacing is designed to be the highest.

Further, as shown in FIG. 9, the sample supplying and storing apparatus 3 includes a main body 31 and a sample displacing device 32.

A sample chamber is provided in the main body 31. A first loading and unloading workstation 311, a second loading and unloading workstation 312, a first temporary storage workstation 313 and a second temporary storage workstation 314 are provided at a bottom of the sample chamber. The first loading and unloading workstation 311, the second loading and unloading workstation 312, the first temporary storage workstation 313 and the second temporary storage workstation 314 are each provided with at least one workstation slot for placing the cassette 33.

A first loading and unloading port (not shown) communicating the sample chamber with the outside of the clean space is provided on the main body 31 at a position corresponding to the first loading and unloading workstation 311, and an experimenter can put a semiconductor material 331 that needs to be experimented into the first loading and unloading workstation 311 through the first loading and unloading port or collect a semiconductor material 331 that has been experimented from the first loading and unloading workstation 311 through the first loading and unloading port. The first loading and unloading port is installed with a first door which may be opened and closed, and the first door may be an existing electric door, which will not be detailed herein.

A second loading and unloading port communicating the sample chamber with the clean space is provided on the main body 31 at a position corresponding to the second loading and unloading workstation 312, and the transfer robot 2 can grasp the cassette 33 with semiconductor materials from the second loading and unloading workstation 312 through the second loading and unloading port, or place the cassette 33 with a processed semiconductor material 331 in the second loading and unloading workstation 312. The second loading and unloading port is installed with a second door which may be opened and closed, and the second door may be an existing electric door, which will not be detailed herein.

The sample displacing device 32 is mounted in the sample chamber for moving the semiconductor sample between the first loading and unloading workstation 311, the second loading and unloading workstation 312, the first temporary storage workstation 313 and the second temporary storage workstation 314. The first temporary storage workstation 313 may be used to store the processed semiconductor material 331, while the second temporary storage workstation 314 may be used to store the semiconductor material 331 to be processed.

The use process is as follows.

After detecting that there are cassettes 33 in the first loading and unloading workstation 311, the sample displacing device 32 moves the cassettes 33 to the second temporary storage workstation 314 in sequence, and then moves corresponding cassettes 33 in the second temporary storage workstation 314 to the second loading and unloading workstation 312 according to scheduling information, waiting for the transfer robot 2 to take away. After detecting that there are cassettes 33 in the second loading and unloading workstation 312, the sample displacing device 32 moves the cassettes 33 to the first temporary storage workstation 313 in sequence, and then moves the corresponding cassettes 33 in the first temporary storage workstation 313 to the first loading and unloading workstation 311 according to scheduling information, waiting for the experimenter to take away. For sequential identification of the cassettes 33, it may be identification of two-dimensional codes or numbers on the cassettes 33, which is not specifically limited herein.

The sample displacing device 32 in the present disclosure may be designed to include a three-axis moving module, a clamping mechanism, and an identification sensor, etc. The three-axis moving module, the clamping mechanism, and the identification sensor use existing designs. Taking the two-dimensional codes as an example, the identification sensor may be a scanner, and taking the identification numbers as an example, the identification sensor may be a camera, which is not specifically limited herein.

Further, as shown in FIG. 9, to facilitate the experimenter to record a schedule, and set experimental parameter, or other requirements, a human-machine interaction device 34 which is communicatively connected with the control apparatus 5 and extends out of the clean space is mounted on the main body 31 at a side of the first loading and unloading port. The control apparatus 5 may be provided in the clean space, which is not specifically limited herein.

Further, as shown in FIG. 1 and FIG. 10, the chemical supplying and storing apparatus 4 is designed to include a chemical buffer box 41. A buffer chamber for storing a chemical tank 15 to be loaded or a replaced chemical tank 15 is provided within the chemical buffer box 41. The chemical buffer box 41 is provided with a buffer opening. A buffer door 42 which can be opened and closed is provided on the buffer opening. The number of chemical buffer boxes 41 is preferably designed to be multiple, such that separate storage of chemical tanks 15 containing different types of chemicals and individual storage of replaced empty chemical tanks 15 can be realized.

Further, as shown in FIG. 1, a floor of the clean space is divided from outside to inside into an outer annular region 61, an inner annular region 62, and a central annular region 63 located within the inner annular region 62.

The wet-processing equipment 1 is arranged in the outer annular region 61 or the central annular area, and the sample supplying and storing apparatus 3 and the chemical supplying and storing apparatus 4 are arranged in the outer annular region 61.

The above layout design forms a loop, which realizes compact arrangement of the apparatus, effectively reduces occupation of the clean space, shortens a travel of the transfer robot, prolongs an endurance time of the transfer robot, and further reduces experimental cost.

A charging pile for charging the transfer robot 2 may be provided on the outer annular region 61. There may be provided at least two transfer robots, to improve the experimental efficiency, and when one of them is short of power, the other one can operate normally to ensure stable experiments.

Further, to realize flexible operations, the mechanical arm device 22 is preferably a cooperative mechanical arm, with a visual sensor for identifying and positioning.

Further, the moving device 21 is an AGV, which is configured with a sensor such as a Lidar for realizing automatic path planning.

A working process of the wet-processing dark laboratory for scientific research designed in the present disclosure is as follows.

1. The identity of an experimenter is verified through the human-computer interaction device 34, and then the type of experiment is selected. After selection, experimental parameters/process routes and the like are set to form an experimental work order, and the control apparatus 5 schedules the newly formed experimental work order according to current operation conditions of wet-processing equipment 1 and a waiting experimental work order.

2. The cassettes 33 with the semiconductor material 331 to be processed are placed into the first loading and unloading workstation 311 through the first loading and unloading port.

3. The control apparatus 5 sends a signal to the sample displacing device 32 according to the experimental work order. The sample displacing device 32 moves the cassettes 33 in the first loading and unloading workstation 311 to the second temporary storage workstation 314, and then waits for an execution signal of the experimental work order. When it is the turn to execute the experimental work order, the control apparatus 5 sends a signal to the sample displacing device 32, the transfer robot 2 and the wet-processing equipment 1, and then the displacing device moves the cassettes 33 from the second temporary storage workstation 314 to the second loading and unloading workstation 312, waiting for the transfer robot 2 to take away.

4. The transfer robot 2 loads the cassettes 33 in the second loading and unloading workstation 312 to a corresponding wet-processing equipment 1 according to the experimental work order.

5. The corresponding wet-processing equipment 1 processes the semiconductor material 331 in the cassettes 33 according to the experimental parameters in the experimental work order, and pushes the cassettes 33 onto the sample carrying mechanism 12 after processing, and sends a signal to the transfer robot 2.

6. The transfer robot 2 transfers the cassettes 33 on the sample carrying mechanism 12 to the second loading and unloading workstation 312, and sends a signal to the sample displacing device 32.

7. The sample displacing device 32 moves the cassettes 33 in the second loading and unloading workstation 312 to the first temporary storage workstation 313, and then waits for the completion of material taking of the previous cassettes 33, and then moves the cassettes 33 from the first temporary storage workstation 313 to the first loading and unloading workstation 311 and feeds back a signal to the control apparatus 5. The control apparatus 5 sends a notification to a mobile terminal of a corresponding experimenter to remind the experimenter to collect the semiconductor material 331 which has been subjected to the experiment, and meanwhile operation data in an experiment process is sorted and analyzed, and is then sent to the experimenter synchronously.

The control apparatus 5 can collect operation data of the execution apparatuses in real time (process recording, process parameter collection, and abnormal event handling), establish a traceable and scalable process library, and optimize the schedule.

Furthermore, the control apparatus 5 can monitor abnormality in the experimental process in real time and automatically initiate a warning.

It can also comprehensively monitor and record history, repair, maintenance and spot check of the apparatus.

The wet-processing dark laboratory for scientific research according to the present disclosure has been illustrated in detail above. Changes may be made to the specific implementation and application scope by those having ordinary skills in the art according to the ideas of embodiments of the present disclosure. To sum up, contents of description should not be construed as limiting the embodiments of the present disclosure.

What is claimed is:

1. A wet-processing dark laboratory for scientific research, comprising a laboratory body, a wet-processing equipment, a transfer robot, a sample supplying and storing apparatus, a chemical supplying and storing apparatus, and a control apparatus: wherein:

the laboratory body is configured to provide a clean space;

the wet-processing equipment is arranged in the clean space for processing a semiconductor sample;

the sample supplying and storing apparatus is arranged in the clean space for providing a semiconductor sample to be processed and storing a processed semiconductor sample;

the chemical supplying and storing apparatus is arranged in the clean space for providing a chemical tank to be replaced and storing a replaced chemical tank;

the transfer robot is installed in the clean space for transferring the semiconductor sample between the wet-processing equipment, the transfer robot, the sample supplying and storing apparatus, and for transferring the chemical tank between the wet-processing equipment, the transfer robot, and the chemical supplying and storing apparatus;

the transfer robot comprises a moving device, a mechanical arm device, at least one end effector, and an accompanying device;

the accompanying device is capable of moving with the moving device and provides a temporary storage space;

the mechanical arm device is mounted on the moving device;

the at least one end effector is mounted on the mechanical arm device for grasping the semiconductor sample and the chemical tank;

the control apparatus is communicatively connected with the wet-processing equipment, the transfer robot, the sample supplying and storing apparatus, and the chemical supplying and storing apparatus;

the accompanying device is detachably connected with the moving device;

the wet-processing dark laboratory for scientific research further comprises an accompanying fixing frame for fixing the accompanying device;

the transfer robot further comprises a forking device;

the forking device is mounted on the moving device for forking the accompanying device positioned on the accompanying fixing frame;

the forking device comprises a forking lifting device and a forking plate; and a driving end of the forking lifting device is connected to the forking plate for driving the forking plate to move up and down, so as to fork the accompanying device off from the accompanying fixing frame or fork the accompanying device back to the accompanying fixing frame;

wherein the accompanying device is internally provided with an accommodating cavity for forming the temporary storage space; and the accompanying device is provided with an accompanying door opening and closing mechanism for controlling opening and closing of the accommodating cavity;

wherein a first interfacing structure is provided at the bottom of the accompanying device;

the first interfacing structure is provided with a first conductive structure electrically connected with the accompanying door opening and closing mechanism;

the moving device is provided with a second interfacing structure which is capable of being interfaced and matched with the first interfacing structure;

the second interfacing structure is provided with a second conductive structure which is capable of contacting the first conductive structure for conducting electricity; and the transfer robot is further configured to supply power to the accompanying door opening and closing mechanism in response to the first conductive structure being in contact with the second conductive structure for conducting electricity.

2. The wet-processing dark laboratory for scientific research of claim 1, wherein the accompanying fixing frame is installed in the clean space.

3. The wet-processing dark laboratory for scientific research of claim 1, wherein the accompanying fixing frame is provided with an avoidance cavity below the accompanying device for the forking plate to extend into; and the forking lifting device is mounted at a top of the moving device.

4. The wet-processing dark laboratory for scientific research of claim 3, wherein a plurality of first forking positioning structures are provided at a top of the forking plate; and a plurality of second forking positioning structures which are matched with the respective first forking positioning structures for positioning are provided at a bottom of the accompanying device.

5. The wet-processing dark laboratory for scientific research of claim 1, wherein the first interfacing structure is provided with a first gas guide structure communicated with the temporary storage space;

the second interfacing structure is provided with a second gas guide structure which is capable of being interfaced and communicated with the first gas guide structure; and a gas supply device which is connected and communicated with the second gas guide structure is mounted on the moving device.

6. The wet-processing dark laboratory for scientific research of claim 1, wherein the accompanying fixing frame comprises two support plates which are arranged symmetrically and spaced apart; and limiting protrusions which are capable of contacting and abutting against tops of the respective support plates are respectively provided at two side surfaces of the accompanying device.

7. The wet-processing dark laboratory for scientific research of claim 1, wherein a floating correction module is provided in the accompanying fixing frame; and the floating correction module is configured to correct a position of the moving device or the forking device extending into the accompanying fixing frame such that the first forking positioning structures directly face the respective second fork positioning structures.

8. The wet-processing dark laboratory for scientific research of claim 1, wherein an anticorrosion liner is provided in the temporary storage space.

9. The wet-processing dark laboratory for scientific research of claim 1, wherein at least two end effectors are provided;

one of the at least two end effectors is configured to grasp the semiconductor sample;

the other of the at least two end effectors is configured to grasp the chemical tank;

the end effectors are detachably connected with the mechanical arm device through a joint assembly; and the accompanying device is provided with placing workstations for placing the end effectors.

10. The wet-processing dark laboratory for scientific research of claim 1, wherein a sample carrying mechanism is mounted below a sample feeding and discharging port on the wet-processing equipment for carrying a semiconductor material to be fed into the sample feeding and discharging port or a semiconductor material discharged from the sample feeding and discharging port.

11. The wet-processing dark laboratory for scientific research of claim 10, wherein the sample carrying mechanism comprises a carrying plate and a sample carrying driving assembly;

the carrying plate is rotatably mounted on the wet-processing equipment; and the sample carrying driving assembly is mounted on the wet-processing equipment and connected with the carrying plate for driving the carrying plate to rotate.

12. The wet-processing dark laboratory for scientific research of claim 1, wherein a floor of the clean space is divided from outside to inside into an outer annular region, an inner annular region, and a central annular region located within the inner annular region;

the wet-processing equipment is arranged in the outer annular region or the central annular region; and the sample supplying and storing apparatus and the chemical supplying and storing apparatus are arranged in the outer annular region.

13. The wet-processing dark laboratory for scientific research of claim 1, wherein the mechanical arm device is a cooperative mechanical arm.

14. The wet-processing dark laboratory for scientific research of claim 1, wherein the moving device is an Automated Guided Vehicle (AGV).

* * * * *